US008728233B2

(12) United States Patent
Friedrich et al.

(10) Patent No.: US 8,728,233 B2
(45) Date of Patent: May 20, 2014

(54) METHOD FOR THE PRODUCTION OF GROUP III NITRIDE BULK CRYSTALS OR CRYSTAL LAYERS FROM FUSED METALS

(75) Inventors: Jochen Friedrich, Eckental (DE); Georg Müller, Langensendlbach (DE); Rainer Apelt, Weilersbach (DE); Elke Meissner, Eckental (DE); Bernhard Birkmann, Cadolzburg (DE); Stephan Hussy, Nürnberg (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 1789 days.

(21) Appl. No.: 11/664,369

(22) PCT Filed: Oct. 4, 2005

(86) PCT No.: PCT/DE2005/001771
§ 371 (c)(1),
(2), (4) Date: Nov. 19, 2007

(87) PCT Pub. No.: WO2006/037310
PCT Pub. Date: Apr. 13, 2006

(65) Prior Publication Data
US 2008/0118648 A1 May 22, 2008

(30) Foreign Application Priority Data
Oct. 5, 2004 (DE) .......................... 10 2004 048 454

(51) Int. Cl.
*C30B 11/00* (2006.01)
(52) U.S. Cl.
USPC .......................... 117/11; 427/376.1; 427/378
(58) Field of Classification Search
None
See application file for complete search history.

(56) References Cited

U.S. PATENT DOCUMENTS 3,218,205 A * 11/1965 Ruehrwein ...................... 117/89
3,364,084 A * 1/1968 Ruehrwein ...................... 117/88
(Continued)

FOREIGN PATENT DOCUMENTS

DE 199 29 591 A1 1/2004 ............ H01L 21/208
(Continued)

OTHER PUBLICATIONS

Akihiko Kikuchi et al., "Effects of V/III supply ratio on improvement of crystal quality of zincblende GaN grown by gas source molecular beam epitaxy using RF-radical nitrogen source", Journal of Crystal Growth 150 (1995) pp. 897-901.*
(Continued)

*Primary Examiner* — Kaj K Olsen
*Assistant Examiner* — Ross J Christie
(74) *Attorney, Agent, or Firm* — Renner Kenner Greive Bobak Taylor & Weber

(57) ABSTRACT

The present invention relates to a method for the production of crystal layers or bulk crystals of group III nitride or of mixtures of different group III nitrides by means of precipitation, at a first temperature $T_1$ in a first temperature range, from a group-III containing fused metal on a group-III-nitride crystal seed placed in the fused metal or on a foreign substrate placed in the fused metal, with the admixture of nitrogen in the fused metal at a pressure P.
With the method a solvent additive is added to the fused metal which increases the conversion rate of group III metal to group III nitride in the fused metal. The fused metal runs through at least one temperature cycle with a first and a second process phase in which cycle the fused metal cools after the first process phase from the first temperature to a second temperature $T_2$ below the first temperature range and at the end of the second process phase is heated from the second temperature back to a temperature within the first temperature range. The described method permits producing group III nitride crystal layers with a thickness of >10 μm, respectively massive crystals with a diameter of >10 mm at dislocation densities of $<10^8$ cm$^{-2}$ at temperatures below 1100° C. and process pressures below $5 \times 10^5$ Pa.

24 Claims, 3 Drawing Sheets

(56) References Cited

U.S. PATENT DOCUMENTS

| | | | |
|---|---|---|---|
| 3,591,340 A * | 7/1971 | Plaskett | 117/77 |
| 3,811,963 A | 5/1974 | Hawrylo et al. | 148/172 |
| 5,185,288 A * | 2/1993 | Cook et al. | 117/56 |
| 5,637,531 A | 6/1997 | Porowski et al. | 117/89 |
| 6,086,672 A * | 7/2000 | Hunter | 117/84 |
| 6,143,629 A * | 11/2000 | Sato | 438/455 |
| 6,214,108 B1 * | 4/2001 | Okamoto et al. | 117/95 |
| 6,252,261 B1 * | 6/2001 | Usui et al. | 257/190 |
| 6,270,569 B1 * | 8/2001 | Shibata et al. | 117/68 |
| 6,562,124 B1 | 5/2003 | Ivantzov et al. | 117/29 |
| 6,656,269 B2 * | 12/2003 | Tomioka | 117/89 |
| 2001/0000733 A1 * | 5/2001 | Tomioka | 427/8 |
| 2002/0016069 A1 * | 2/2002 | Tomioka | 438/689 |
| 2002/0168844 A1 * | 11/2002 | Kuramoto et al. | 438/604 |
| 2003/0038302 A1 * | 2/2003 | Yanashima et al. | 257/200 |
| 2003/0164138 A1 * | 9/2003 | Sarayama et al. | 117/84 |
| 2003/0183155 A1 * | 10/2003 | D'Evelyn et al. | 117/68 |
| 2004/0144300 A1 | 7/2004 | Kitaoka et al. | 117/2 |
| 2004/0206966 A1 * | 10/2004 | Sugawara et al. | 257/85 |
| 2004/0245535 A1 * | 12/2004 | D'Evelyn et al. | 257/94 |
| 2004/0250747 A1 | 12/2004 | Sasaki et al. | 117/2 |
| 2005/0059229 A1 * | 3/2005 | Minemoto et al. | 438/602 |
| 2005/0098095 A1 * | 5/2005 | D'Evelyn et al. | 117/105 |

FOREIGN PATENT DOCUMENTS

| | | | |
|---|---|---|---|
| EP | 0 615 952 A2 | 9/1994 | C01B 21/06 |
| JP | 06-016415 | 1/1994 | C01B 35/14 |
| JP | 09 134878 | 5/1997 | H01L 21/203 |
| JP | 09134878 A * | 5/1997 | |
| JP | 2002-293696 | 9/2002 | C03B 29/38 |
| JP | 2004-224600 | 8/2004 | C30B 29/38 |
| WO | WO 95/04845 | 2/1995 | C30B 11/00 |
| WO | WO 03/035945 A2 | 5/2003 | |
| WO | WO 2004/061923 A1 | 7/2004 | H01L 21/20 |
| WO | WO 2006/037310 A1 | 4/2006 | C30B 17/00 |
| WO | WO 2006/037311 A2 | 4/2006 | |

OTHER PUBLICATIONS

*Crystal Growth and liquid-phase epitaxy of gallium nitride*—C. Klemenz—Journal of Crystal Growth (2000) 62-67.

*Growth of nitride crystals, BN, AlN, and GaN by using a Na flux*—Yano et al—Diamond and Related Materials 9 (2000) 512-515.

*Growth of a Large GaN Single Crystal Using the Liquid Phase Epitaxy (LPE)Technique*—Kawamura—Jpn. J Appl. Phys. vol. 42 (2003) pp. L4-L6.

*Heteroepitaxial Thermal Gradient Solution Growth of a GaN*—R. A. Logan et al.—Electrochem. Soc., Dez. 1972, vol. 119 (112) 2.1727.

Office Action of Oct. 1, 2009 in U.S. Appl. No. 11/664,370.
Response as filed Dec. 30, 2009 in U.S. Appl. No. 11/664,370.
Office Action of Mar. 11, 2010 in U.S. Appl. No. 11/664,370.
Response as filed Jun. 7, 2010 in U.S. Appl. No. 11/664,370.

*Crystal Growth of GaN by the Reaction Between Gallium and Ammonia*—Elwell et al—Journal of Crystal Growth—Bd. 66, 1984, pp. 45-54.

*Crystla Growth of FaN by the Reaction Between Gallium and Ammonia*—Elwell et al—Journal of Crystal Growth—Bd. 66, 1984, pp. 45-54, Title should recite "GaN" not "FaN".

*Synthesis of Gallium Nitride From Ammonium Chloride and Gallium*—Marinace—IBM Technical Disclosure Bulletin, IBM Corp. New York, US, Bd. 15, Nr. 5, Oct. 1972.

*Single-Crystalline Gallium Nitride Nanobelts*—B.S. Yong et al.—Applied Physics Letters, vol. 81, No. 1—Jul. 2002.

*Ain Single Crystals*—Slack et al—Journal of Crystal Growth 42 1977—pp. 560-563.

c:/epoquenetdata/eplogf/internal.log—Qinghua et al, publication date Jun. 1, 1995.

* cited by examiner

METHOD FOR THE PRODUCTION OF GROUP III NITRIDE BULK CRYSTALS OR CRYSTAL LAYERS FROM FUSED METALS

TECHNICAL FIELD OF APPLICATION

The present invention relates to a method for producing group III nitride bulk crystals or crystal layers on a group III nitride crystal seed or a foreign substrate by precipitating from group-III-containing fused metals. The method permits producing group III nitride substrates with an area greater than 100 mm$^2$ and group III nitride bulk crystals with a diameter of >10 mm, with dislocation densities of ≤10$^8$ cm$^{-2}$ and at process pressures <5×10$^5$ Pa. The invented method is primarily employed in the field of optoelectronics, communication technology and high frequency technology in the production of semi-conductor components and composite semiconductor components based on the III-V material system.

PRIOR ART

Nitride-based semiconductors and composite semiconductors are a material system that as yet finds relatively little use in industry. Gallium nitride (GaN) is a semiconductor with a large direct band gap (3.4 eV). With its homologous aluminum nitride (AlN, band gap 6.3 eV) and indium nitride (InN, band gap 1.9 eV), it forms ternary mixed crystals, enabling covering a spectral range of 6.3 eV-1.9 eV.

In order to be able to fully utilize the material-specific advantages of Group III nitride-based components, the components must be precipitated on substrates that have the same longitudinal expansion and lattice pattern as that of the group III nitride crystals. Iso-structured group III nitride substrates are therefore just as suited for producing group III nitride-based components as pure group III nitride substrates.

A basic difficulty for industrial mass production of group III nitride-based components is the fact that presently there is not a sufficient amount or quality of group III nitride substrates available on which to precipitate homoepitactic components. The group III nitride components, therefore are precipitated on not adapted foreign substrates, in particular sapphire and silicon carbide, with the corresponding drawbacks in the performance and longevity of the produced components produced in this manner. Today especially metal organic vapor phase epitaxy (MOVPE) processes are used for precipitating group III nitride components on the substrates.

The techniques employed up to now to produce group III nitride substrates, respectively bulk crystals are essentially gas phase processed, i.e. the required components are provided as metal-organic, inorganic or metal starting substances and converted to gaseous reactants in complicated reactors under the addition of hydrogen, ammonia and hydrogen chloride at high temperatures (1100° C.) and finally converted to group III nitrides.

Hydride vapor phase epitaxy (HVPE) processes have proven especially suited for producing GaN substrate due to the achievable high quality of the GaN crystal layers and the high growth rates of up to 100 μm/h. In the HVPE process, hydrogen chloride flows over liquid gallium, usually at temperatures between 800-900° C., yielding gallium chloride and hydrogen. The reaction of the gaseous gallium chloride with ammonium, which is added to the reactor separately, gallium nitride according to the equation GaCl+NH$_3$→GaN+H$_2$+HCl occurs in the reaction zone on the foreign substrate. The feasibility of producing thin and thick gallium substrate layers with a diameter of 5 cm, respectively gallium nitride bulk crystals with a diameter of 5 cm has already been demonstrated for the HVPE process.

Known are moreover processes for sublimation growth (sandwich sublimation techniques, SST), high-pressure solution growth (high pressure growth, HPSG) and for ammonothermal growth (ammonothermal growth technique, AGT) of GaN crystals, respectively GaN crystal layers. These processes are complicated and require in some cases very expensive technical devices. Up to now, it has been possible to produce GaN crystal layers with a thickness of 100 μm and lateral dimensions of about 1 cm with the high pressure solution growth process.

According to the state of the art, however, the HVPE process is the only method that can provide the GaN substrates in certain amounts for the production of demonstrator components. However, the amounts and the quality, in particular the size of the GaN substrate achievable with the HVPE process is not sufficient for industrial production. Moreover, the technical complexity and the related costs of the HVPE process are very high.

On the other hand, the hitherto known applications of solution growth of group III nitride substrates from liquid fuse metals have not yielded results comparable to those of the HVPE process.

DESCRIPTION OF THE INVENTION

The object of the present invention is to provide an industrially useable production process with which group III nitrides can be produced either as layer crystals or as bulk crystals with a diameter of >10 mm, with dislocation densities≤10$^8$ cm$^{-2}$ and at process pressures<5×10$^5$ Pa and at temperatures≤1100° C.

The object is solved by using the method according to claim 1. Advantageous features that further develop the inventive idea are the subject matter of the subordinate claims and the description, in particular with reference to the preferred embodiment.

The invented method of producing crystal layers or bulk crystals of the group III nitride or of mixtures of different group III nitrides by means of precipitation from group-III-containing fused metals at a first temperature in a first temperature range on a group III nitride crystal seed placed into the fused metal or on a foreign substrate, with an admixture of nitrogen in the fused metal at a pressure P, is distinguished in that added to the fused metal is a solvent additive that increases the conversion rate of group III metal to group III nitride in the fused metal. Furthermore, the fused metal runs through at least one temperature cycle with a first and a second phase. In this temperature cycle, the fused metal cools after the end of the first phase from the first temperature T$_1$ to a second temperature T$_2$ below the first temperature range and at the end of the second phase from the second temperature it is heated back to a temperature T3 in the first temperature range.

The selection of the first temperature range and thus the temperatures T$_1$ and T$_3$ and the lowering of the temperature between T$_1$ T$_2$ and therefore the selection of the temperature T$_2$ depend on the selection of the group III metal, the solvent additive and its concentration in the fused metal, the type of nitrogen admixture in the fused metal and the process pressure.

The invented method is a solution growth process (liquid phase epitaxy, LPE), or more precisely a low pressure solution growth method (low pressure solution growth, LPSG).

Preferably the elements aluminum, gallium and indium are used to produce the group III fused metal.

In the solution growth method of producing group III nitride crystals, the precipitation rate of the group III nitride crystals on the crystal seed or on the substrate is basically determined by the conversion rate of the group III metal to group III nitride in the fused metal. However, pure group III fused metals show little conversion of group III metal to group III nitride with suited nitrogen admixture.

In the invented method, at least one solvent additive is used in the group-III-containing fused metal, which increases the conversion rate and enables controlled crystallization of group III nitrides.

Added as the solvent additive is at least one element of the elements C, Si, Ge, Fe, Sn, Bi, Cr, Ni, Zn, Pb, and/or at least one element of the rare earths or an alloy or a compound of these elements, in particular their nitrides of the group-III-containing fused metal.

In the invented method, the fused metal is heated to a suited first temperature $T_1$ before a first process phase begins, in a temperature range between 800° C. and 1100° C. In this first process phase, precipitation of group III nitride crystals on the substrates or crystal seeds placed in the fused metal, thus crystal growth, occurs. The first temperature $T_1$ and the other process parameters, such as for example process pressure and solid or gaseous admixture of nitrogen, is preferably kept constant during the first process phase.

The first process phase ends by cooling the fused metal to a second temperature $T_2$ below the first temperature range and is conveyed into a second process phase. Temperature lowering from $T_1$ to $T_2$ is at least 30K. Lowering the temperature leads to greatly reduced or stopped crystal growth and prevents the fused metal from creeping out of its container, which is well-known.

In the second phase, the additional admixture of nitrogen can be reduced or stopped, intensifying in this manner the described effects.

The second process phase begins with the cooling of the fused metal from the first temperature $T_1$ to the second temperature $T_2$ and ends, after subsequent heating of the fused metal to a temperature $T_3$, within the first temperature range. As soon as the second temperature $T_2$ is reached, heating to the temperature of $T_3$ can fundamentally occur.

Advantageous is, however, a hold period from one minute to several hours at the temperature $T_2$.

After heating the fused metal to the temperature $T_3$, another first process phase follows this second process phase. The temperature $T_3$ can, but does not have to, be identical to the temperature $T_1$. Essential for further crystal growth is, however, that $T_3$ lies within the first temperature range.

Surprising is that it has proven that this additional first phase can be extended in the magnitude of 100 hours and crystal growth is possible without major parasitic deposits occurring or the fused metal creeping up the walls of its container.

If the invented temperature cycle is continued, i.e. a first and a second process phase follow each alternately, dislocation densities of substantially less than $10^8$ cm$^{-2}$ can be achieved in the developing crystal layers. Moreover, very long overall process durations are possible, and crystals or substrates of the desired size can be generated.

Due to the stopped or greatly diminished crystal growth during the second process phase and further crystal growth while continuing the invented temperature cycle, boundary areas or boundary layers develop in the precipitated crystals. These boundary layers or boundary areas can be proven microscopically. As a consequence, group III nitride bulk crystals or substrates produced with this method can subsequently be clearly identified.

In the invented method, the nitrogen admixture in the fused metal occurs using a reactive, particularly solid or gaseous, nitrogen-containing material, preferably gallium nitride (GaN), ammonia (NH$_3$) or hydrazine (H$_2$N—NH$_2$), and a nitrogen-containing (N$_2$) carrier gas, in particular a mixture of nitrogen (N$_2$) and hydrogen (H$_2$).

Moreover, an advantageous further development of the method improves the transport of the nitrogen in the fused metal by generating a convection in the fused metal, for example by means of mechanical stirring or with the aid of magnetic fields, increasing in this manner the transport rate of the added nitrogen through the surface of the fused metal into the fused metal, thereby contributing to further increasing the conversion rate of Ga to GaN. The precipitation rate of GaN on the crystal seed from the fused metal is raised in this manner.

BRIEF DESCRIPTION OF THE DRAWINGS

The present invention is made more apparent in the following using a preferred embodiment with reference to the accompanying drawings by way of example without the intention of limiting the scope or spirit of the general inventive idea.

WAYS TO CARRY OUT THE INVENTION

The invented method is described in the following by way of example using the production of GaN crystal layers as an example.

Figure 1:
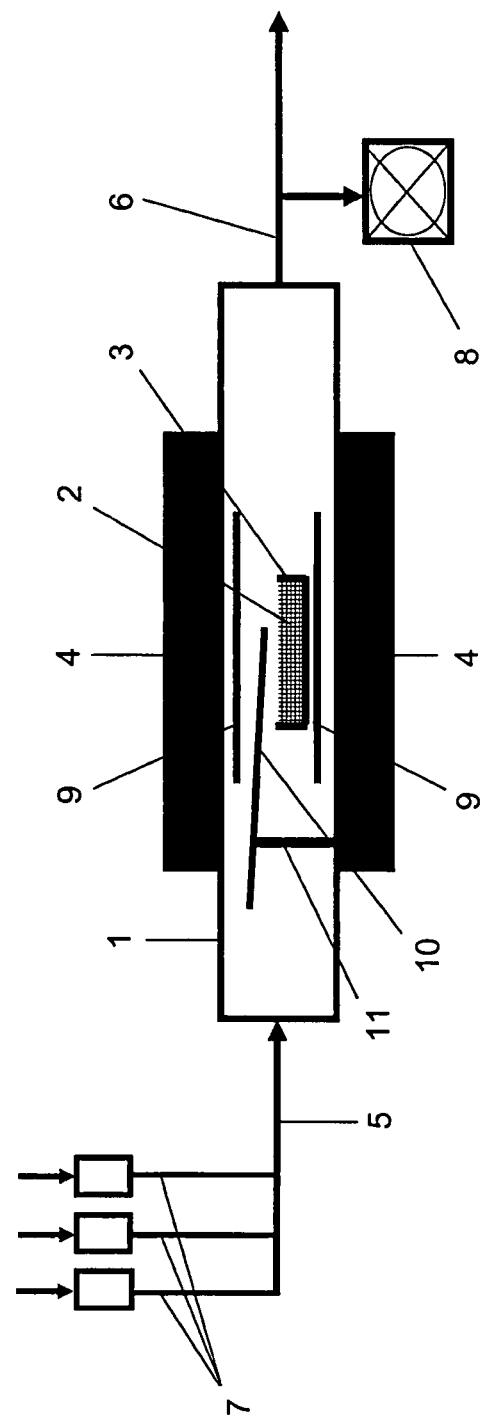
FIG. 1 shows a schematic representation of the model reactor.

FIG. 1 shows a schematic representation of a model reactor with which the preferred embodiment described in the following is carried out.

The model reactor comprises a closeable heat-resistant quartz glass phial 1 which is surrounded in the direction of its longitudinal axis by a tube oven 4. For reasons of purity, the quartz glass phial 1 contains no graphite components and, in particular, no quartz glass that is in contact with the fused metal. The tube oven 4 is a horizontally positioned resistance heated oven with a heating zone. It is also possible to use upright positioned inductive heated ovens or radiation heated ovens with several heating zones or ovens heated by other means. The fused metal 2 is located in a crucible 3 of boric nitride inside the quartz glass phial 1. The crucible 3 is placed on a quartz glass liner 9 inside the quartz glass phial 1. In the quartz glass phial 1 is a seed rod 10 on which a crystallization seed can be attached. The seed rod can be operated via a mechanics 11 in such a manner that one end of the seed rod 10 on which the crystallization seed is attached can be dipped into the fused metal 2 and removed again. The quartz glass phial 1 has a gas inlet 5 for flowing in the carrier gas and the reactive, gaseous nitrogen-containing material as well as an exhaust outlet 6. The gas inlet 5 is designed in such a manner that the gas enters near the surface of the fused metal 2. The exhaust outlet 6 is connected to a turbo molecular pump 8 with which the quartz glass phial can be evacuated.

At beginning of the method, Ga and Ge as a solvent additive is placed in the cleaned crucible 3. The purity of Ga and Ge is better than 5N. A group III nitride crystal is used as the crystallization seed.

At the beginning of the process, first a purifying phase is run through. The quartz glass phial 1 is evacuated to a pressure of <1 Pa and the fused metal is heated to between 500° C. and 600° C. Upon reaching stable temperature conditions, these conditions are maintained for at least one hour and a gas mixture of nitrogen ($N_2$) and hydrogen ($H_2$) is added to the quartz glass phial 1. The purifying phase ends as soon as the crucible 3 is heated to the first temperature $T_1$ of 950° C. The crystallization seed attached to the seed rod 10 is dipped into the fused metal 2. Upon reaching the temperature $T_1$, ammonia ($NH_3$) is introduced into the quartz glass phial in addition to the carrier gas ($N_2$ and $H_2$). The gas mixture ratio is controlled by the mass flow regulator 7. The flow of the ammonia is set in such a manner that it approximates a equilibrium partial pressure. Due to the introduction of the ammonia, an admixture of nitrogen occurs at the surface of the fused metal. The conversion rate of Ga to GaN is raised significantly by the Ge contained in the fused metal.

At the end of the approximately ten-hour first process phase (crystal growth phase), at the beginning of the second phase the temperature of the fused metal is lowered from $T_1$=950° C. to the second temperature $T_2$=800° C., thereby preventing the fused metal from creeping out of the crucible. Crystal growth comes to a standstill in the second process phase. After a one-hour hold period at the second temperature $T_2$=800° C., the fused metal is heated to the temperature $T_3$=950° C. In this manner the second process phase is followed by another ten-hour first process phase of crystal growth.

In the preferred embodiment, the temperatures $T_1$ and $T_3$ are selected identical to 950° C. Furthermore, the addition of carrier gas and of ammonia during the first and second process phase remains unchanged. The temperature cycle is continued by alternating a first and a second process phase until crystals or crystal layers of the desired size have developed.

Figure 2A:
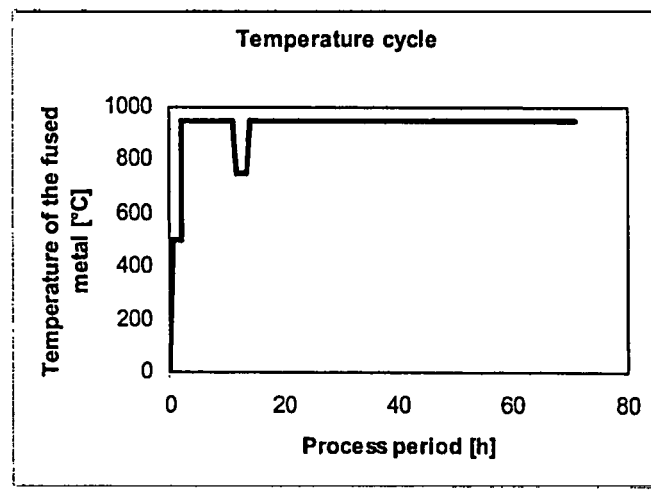
FIG. 2 shows the temperature cycles of the invented method.
Figure 2B:
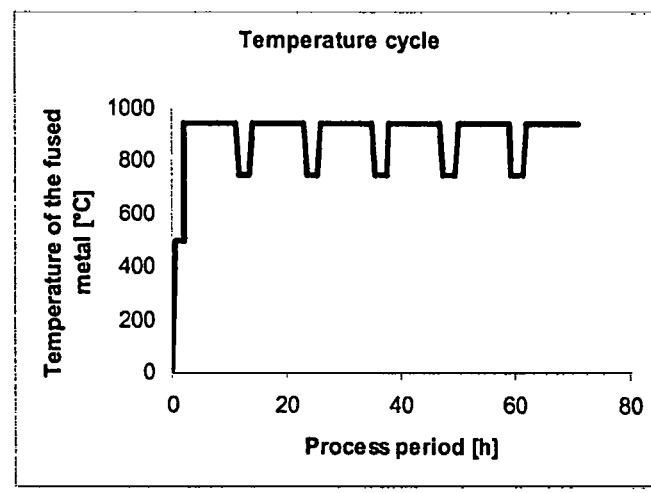

FIGS. 2a and 2b show schematic representations of two invented temperature cycles. In each case, the temperature of the fused metal is plotted over the time axis.

In FIG. 2a, a complete temperature cycle comprising a first and a second process phase is run through, followed by only one other first process phase the duration of which can be many times longer than the duration of the initial first process phase.

In FIG. 2b, several complete temperature cycles comprising first and second phases are run through. The succession of a first and a second process phase is repeated until a GaN crystal, respectively a GaN crystal layer with the desired dimensions has grown.

In both FIG. 2a and FIG. 2b at the beginning of each process there are, as previously described, purifying phases.

Figure 3:
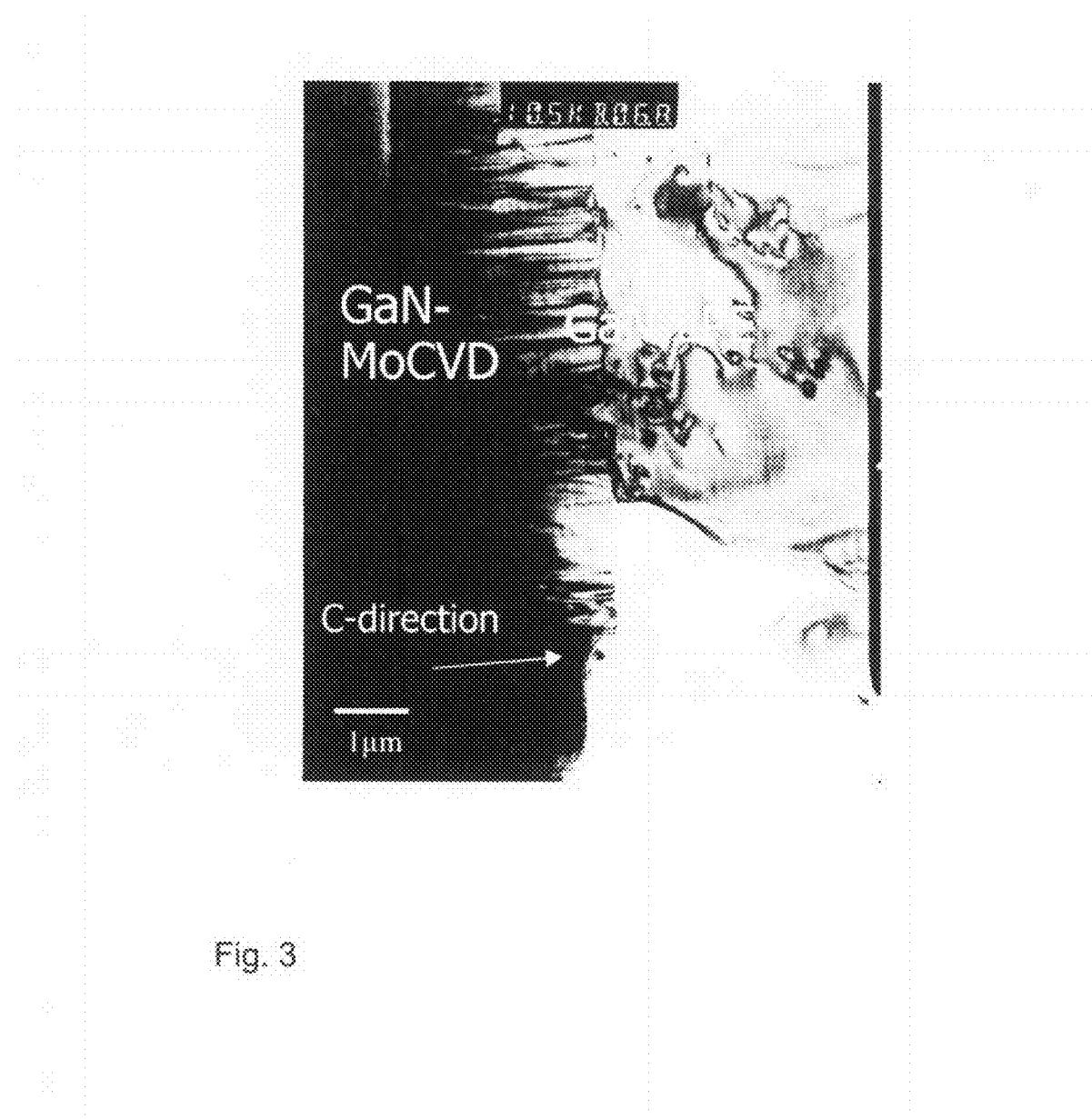
FIG. 3 shows a transmission electron microscope image: cross section of a GaN crystal layer placed on a substrate using the invented method.

FIG. 3 is a transmission electron microscope (TEM) image. The image shows a cross section of several crystal layers of a GaN substrate. Three areas (layers) are visible. A homogeneous area on the left shows the foreign substrate. First a GaN crystal layer is placed on the homogeneous area by means of metal organic chemical vapor deposition (MOCVD). This middle crystal layer possesses longitudinal structures running perpendicular to the surface of the base substrate. These structures are dislocations in the crystal structure, indicating great dislocation densities in this layer. Another GaN crystal layer (right area) is placed on this crystal layer using the invented method of solution growth (liquid phase epitaxy, LPE). It is distinctly evident that the areas of greater dislocation density (longitudinal structures) in the middle crystal layer do not continue in the right crystal layer, that the GaN crystal layer generated according to the invented method is distinguished in the TEM image by a less structured area and thus by substantially lower dislocation densities.

The essential advantage of the method over prior art methods is:

- a longer overall process duration due to prevention of the fused metal from creeping out of the container,
- the as a result possible production of group III nitride substrates with an area of more than 100 m² and of group III nitride massive crystals with a diameter of >10 mm with dislocation densities of ≤$10^8$ cm$^{-2}$ at process pressures of <5×$10^5$ Pa,
- substantially reduced equipment and process costs in the production of group III nitride substrates or massive crystals and
- relative simple up-scaling of the method for industrial production of group III nitride crystals or substrates.

LIST OF REFERENCES

1 quartz glass phial
2 sample of a group III fused metal with a solvent additive
3 crucible
4 tube oven
5 gas inlet
6 exhaust outlet
7 mass flow regulator
8 turbo molecular pump
9 quartz glass liner
10 seed rod
11 mechanics for dipping the seed rod into the fused metal

The invention claimed is:

1. A method for the production of crystal layers or bulk crystals of group III nitride or of mixtures of different group III nitrides by a low pressure solution growth process wherein by means of precipitation, at a first temperature $T_1$ in a first temperature range, from a group-III containing fused metal on a group-III-nitride crystal seed placed in the fused metal or on a foreign substrate placed in the fused metal, with the admixture of nitrogen in the fused metal at a pressure P, whereby a solvent additive is added to the fused metal which increases the conversion rate of group III metal to group III nitride in the fused metal, the fused metal running through at least one temperature cycle while said group-III-nitride crystal seed or said foreign substrate is placed in the fused metal, said temperature cycle comprising a first and a second process phase in which the fused metal is cooled after the first process phase from the first temperature $T_1$ to a second temperature $T_2$ below the first temperature range and at the end of the second process phase is heated from the second temperature $T_2$ back to a temperature within the first temperature range, wherein a purifying phase is provided in which a limited volume located above the fused metal is evacuated, the fused metal is heated and then a gas mixture of nitrogen ($N_2$) and hydrogen ($H_7$) is flowed through the limited volume above the fused metal.

2. A method according to claim 1, wherein the nitrogen admixture in the fused metal occurs at pressures below 5×$10^5$ Pa.

3. A method according to claim 1, wherein the upper limit of the first temperature range is ≤1100° C.

4. A method according to claim 1, wherein a gas or a gas mixture is employed as the nitrogen admixture in the fused metal.

5. A method according to claim 4, wherein employed for the nitrogen admixture in the fused metal is a gas mixture comprising a carrier gas and a reactive nitrogen-containing material.

6. A method according to claim 5, wherein a mixture of nitrogen ($N_2$) and hydrogen ($H_2$) is employed as the carrier gas and ammonia ($NH_3$) or hydrazine ($H_2N$—$NH_2$) is employed as the reactive nitrogen-containing substance.

7. A method according to claim 1, wherein a solid material or a solid material mixture is employed as the nitrogen admixture in the fused metal.

8. A method according to claim 7, wherein GaN is employed as the nitrogen admixture in the fused metal.

9. A method according claim 1, wherein the purifying phase is maintained for at least one minute and occurs at temperatures of the fused metal of between 500° C. and 600° C.

10. A method according to claim 1, wherein the first process phase is maintained for a period of at least 1 hour.

11. A method according to claim 1, wherein the second temperature $T_2$ lies at least 30K below the first temperature $T_1$.

12. A method according to claim 1, wherein convection is generated in the fused metal in order raise a transport rate of the nitrogen through the fused metal in direction to the growing crystal.

13. A method according to claim 1, wherein the second temperature $T_2$ or the nitrogen admixture in the fused metal in the second process phase is set in such a manner that precipitation of group III nitride from the group-III-containing fused metal onto a crystal seed or a substrate is decreased or comes to a standstill.

14. A method for the production of crystal layers or bulk crystals of group III nitride or of mixtures of different group III nitrides by a low pressure solution growth process wherein by means of precipitation, at a first temperature $T_1$ in a first temperature range, from a group-III containing fused metal on a group-III-nitride crystal seed placed in the fused metal or on a foreign substrate placed in the fused metal, with the admixture of nitrogen in the fused metal at a pressure P, whereby a solvent additive is added to the fused metal which increases the conversion rate of group III metal to group III nitride in the fused metal, the fused metal running through at least one temperature cycle while said group-III-nitride crystal seed or said foreign substrate is placed in the fused metal, said temperature cycle comprising a first and a second process phase in which the fused metal is cooled after the first process phase from the first temperature $T_1$ to a second temperature $T_2$ below the first temperature range and at the end of the second process phase is heated from the second temperature $T_2$ back to a temperature within the first temperature range, wherein convection is generated in the fused metal in order raise a transport rate of the nitrogen through the fused metal in direction to the growing crystal.

15. A method according to claim 14, wherein the nitrogen admixture in the fused metal occurs at pressures below $5 \times 10^5$ Pa.

16. A method according to claim 14, wherein the upper limit of the first temperature range is 1100° C.

17. A method according to claim 14, wherein a gas or a gas mixture is employed as the nitrogen admixture in the fused metal.

18. A method according to claim 17, wherein employed for the nitrogen admixture in the fused metal is a gas mixture comprising a carrier gas and a reactive nitrogen-containing material.

19. A method according to claim 18, wherein a mixture of nitrogen ($N_2$) and hydrogen ($H_2$) is employed as the carrier gas and ammonia ($NH_3$) or hydrazine ($H_2N$—$NH_2$) is employed as the reactive nitrogen-containing substance.

20. A method according to claim 14, wherein a solid material or a solid material mixture is employed as the nitrogen admixture in the fused metal.

21. A method according to claim 20, wherein GaN is employed as the nitrogen admixture in the fused metal.

22. A method according to claim 14, wherein the first process phase is maintained for a period of at least 1 hour.

23. A method according to claim 14, wherein the second temperature $T_2$ lies at least 30K below the first temperature $T_1$.

24. A method according to claim 14, wherein the second temperature $T_2$ or the nitrogen admixture in the fused metal in the second process phase is set in such a manner that precipitation of group III nitride from the group-III-containing fused metal onto a crystal seed or a substrate is decreased or comes to a standstill.

* * * * *

UNITED STATES PATENT AND TRADEMARK OFFICE
CERTIFICATE OF CORRECTION

| | | |
|---|---|---|
| PATENT NO. | : 8,728,233 B2 | Page 1 of 1 |
| APPLICATION NO. | : 11/664369 | |
| DATED | : May 20, 2014 | |
| INVENTOR(S) | : Friedrich et al. | |

It is certified that error appears in the above-identified patent and that said Letters Patent is hereby corrected as shown below:

In the Claims:

In Column 8, line 15 (Claim 16, line 2) the word "1100° C" should read -- $\leq$ 1100° C --.

Signed and Sealed this
Fourteenth Day of October, 2014

Michelle K. Lee
*Deputy Director of the United States Patent and Trademark Office*